(12) United States Patent
Heinle et al.

(10) Patent No.: US 10,276,669 B2
(45) Date of Patent: Apr. 30, 2019

(54) SLOPED FIELD PLATE AND CONTACT STRUCTURES FOR SEMICONDUCTOR DEVICES AND METHODS OF MANUFACTURING THEREOF

(71) Applicant: Infineon Technologies Austria AG, Villach (AT)

(72) Inventors: Jens Ulrich Heinle, Villach (AT); Gerhard Prechtl, Rosegg (AT); Gilberto Curatola, Villach (AT)

(73) Assignee: Infineon Technologies Austria AG, Villach (AT)

(*) Notice: Subject to any disclaimer, the term of this patent is extended or adjusted under 35 U.S.C. 154(b) by 2 days.

(21) Appl. No.: 15/410,233

(22) Filed: Jan. 19, 2017

(65) Prior Publication Data

US 2018/0204915 A1  Jul. 19, 2018

(51) Int. Cl.
| | |
|---|---|
| *H01L 29/66* | (2006.01) |
| *H01L 29/40* | (2006.01) |
| *H01L 21/311* | (2006.01) |
| *H01L 21/3205* | (2006.01) |
| *H01L 21/3115* | (2006.01) |
| *H01L 21/02* | (2006.01) |
| *H01L 29/20* | (2006.01) |
| *H01L 21/283* | (2006.01) |
| *H01L 29/778* | (2006.01) |
| *H01L 29/423* | (2006.01) |
| *H01L 21/033* | (2006.01) |
| *H01L 21/768* | (2006.01) |

(52) U.S. Cl.
CPC ........ *H01L 29/402* (2013.01); *H01L 21/0217* (2013.01); *H01L 21/02126* (2013.01); *H01L 21/02271* (2013.01); *H01L 21/02274* (2013.01); *H01L 21/0335* (2013.01); *H01L 21/283* (2013.01); *H01L 21/31111* (2013.01); *H01L 21/31116* (2013.01); *H01L 21/31144* (2013.01); *H01L 21/31155* (2013.01); *H01L 21/32051* (2013.01); *H01L 21/76804* (2013.01); *H01L 29/2003* (2013.01); *H01L 29/42376* (2013.01); *H01L 29/66462* (2013.01); *H01L 29/7787* (2013.01)

(58) Field of Classification Search
CPC .......... H01L 21/02126; H01L 21/0217; H01L 21/02271; H01L 21/02274; H01L 21/0335
USPC ......................... 257/374, 446, 501, 506, 497
See application file for complete search history.

(56) References Cited

U.S. PATENT DOCUMENTS

| | | | |
|---|---|---|---|
| 3,769,109 A | 10/1973 | MacRae et al. | |
| 4,543,707 A | 10/1985 | Ito et al. | |
| 4,885,261 A | 12/1989 | Yoshikawa | |
| 5,907,181 A | 5/1999 | Han et al. | |
| 7,652,420 B2 * | 1/2010 | Kim | H01L 27/3276 313/500 |

(Continued)

*Primary Examiner* — Tan N Tran
(74) *Attorney, Agent, or Firm* — Murphy, Bilak & Homiller, PLLC

(57) ABSTRACT

A semiconductor device includes a base layer, a dielectric layer over the base layer, an opening extending through the dielectric layer and to a main surface of the base layer, the opening having a sloped sidewall, and an electrically conductive material over the sloped sidewall. An angle between the sloped sidewall and the main surface of the base layer is in a range between 5 degrees and 50 degrees. Corresponding methods of manufacturing the semiconductor device are also provided.

23 Claims, 12 Drawing Sheets

(56) References Cited

U.S. PATENT DOCUMENTS

| | | | |
|---|---|---|---|
| 8,629,960 B2 * | 1/2014 | Moriwaki | G02F 1/136227 |
| | | | 349/122 |
| 9,064,871 B2 * | 6/2015 | Bao | H01L 21/76832 |
| 9,972,570 B2 * | 5/2018 | Wei | H01L 21/0332 |
| 2014/0231911 A1 | 8/2014 | Kim et al. | |

* cited by examiner

SLOPED FIELD PLATE AND CONTACT STRUCTURES FOR SEMICONDUCTOR DEVICES AND METHODS OF MANUFACTURING THEREOF

TECHNICAL FIELD

The present application relates to semiconductor devices, in particular field plate and contact structures for semiconductor devices.

BACKGROUND

Breakdown strength, reliability and lifetime of III-nitride power semiconductor devices such as gallium nitride (GaN) devices are reduced by high electric fields in the devices. Conventional field plate fabrication processes can reduce electrical fields in power semiconductor devices, but are not sufficient for many applications. As a consequence, device dimensions such as gate-drain distance or dielectric thickness are often increased to avoid premature device breakdown at high voltages and circumvent reliability and lifetime issues. However, increased gate-drain distance and dielectric thickness leads to increased cost and deterioration of switching characteristics. As such, there is a need for power semiconductor devices with a more homogeneous potential distribution at the source, drain and gate contacts and in the drift region of the device, respectively.

SUMMARY

According to an embodiment of a method of forming an opening in a dielectric layer, the method comprises: depositing a dielectric layer over a base layer; etching an opening through the dielectric layer and to a main surface of the base layer, the opening having a sloped sidewall, wherein an angle between the sloped sidewall and the main surface of the base layer is in a range between 5 degrees and 50 degrees; and depositing an electrically conductive material over the sloped sidewall.

According to an embodiment of a semiconductor device, the semiconductor device comprises: a base layer; a dielectric layer over the base layer; an opening extending through the dielectric layer and to a main surface of the base layer, the opening having a sloped sidewall; and an electrically conductive material over the sloped sidewall. An angle between the sloped sidewall and the main surface of the base layer is in a range between 5 degrees and 50 degrees.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide fabrication techniques for manufacturing electronic contacts and field plates on power semiconductor devices which achieve a more homogeneous potential distribution at the source, drain and/or gate contacts and in the drift region of the device, respectively. The etching processes described herein yield dielectric layer openings with sloped (slanted) sidewalls. The angle between the sloped sidewalls of the dielectric layer openings and the main surface of the underlying base layer is in a range between 5 degrees and 50 degrees. Angles between 5 and 50 degrees can yield effective reduction of electric fields. A homogeneous or nearly homogeneous electric field distribution can be realized by depositing an electrically conductive material on the sloped sidewalls of the dielectric openings. The electrically conductive material forms or is connected to an electrical contact of the device such as source, drain, gate or field plate.

Sloped sidewall angles between 5 and 50 degrees can be produced by etching a dielectric layer whose surface has been modified by implantation and/or by deposition of an additional dielectric layer. In both cases, different lateral etch rates are utilized. In the case of modification by implantation, the lateral etch rate of the upper part of a dielectric layer is increased by a damage implantation. In the case of deposition of an additional dielectric layer, the upper (additional) dielectric layer has a higher lateral etch rate than the lower dielectric layer. Dielectric layers with different lateral etch rates can be used, and/or the lateral etch rate of the upper (additional) dielectric layer can be increased by a damage implantation step. In each case, subsequent dielectric etching yields openings with sidewalls that slope at an angle in a range between 5 degrees and 50 degrees with respect to the main surface of the underlying base layer. The underlying base layer can be a semiconductor material such as Si, SiC, GaAs, a III-nitride material such as AlGaN, GaN, p-doped GaN, n-doped GaN, AlN, InN, InAlN, etc. The underlying base layer instead can be an oxide such as $SiO_2$, TaO, HfO, etc., a nitride such as SiN, SiON, etc. or any other suitable base material used in power semiconductor devices and to which or through which electrically conductive contacts are formed such as source, gate and/or drain contacts, field plate structures, etc.

Figure 1:
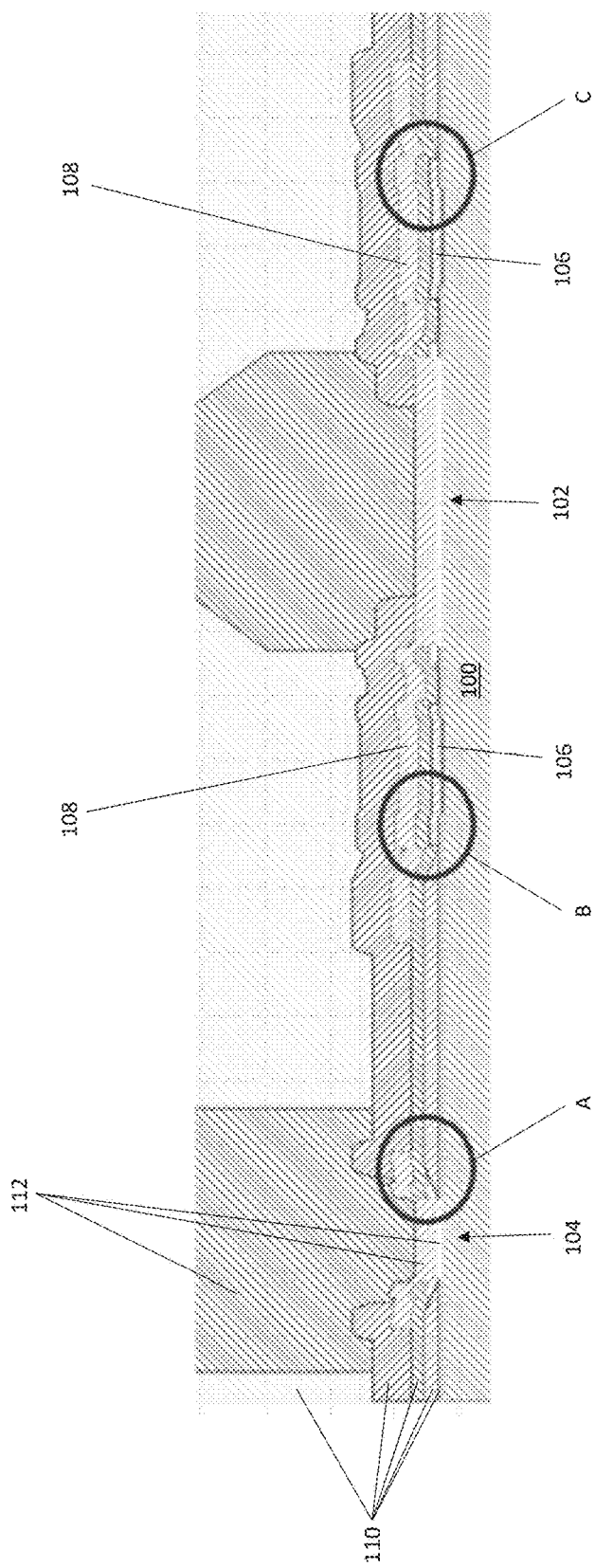
FIG. 1 illustrates a sectional view of an embodiment of a semiconductor device having field plate and contact structures with sloped sidewalls.

FIG. 1 illustrates an embodiment of a power semiconductor device having dielectric layer openings with sloped (slanted) sidewalls, the openings extending to an underlying base layer. The angle between the sloped sidewalls and the main surface of the underlying base layer is in a range between 5 degrees and 50 degrees. In some cases, the angle between the sloped sidewall and the main surface of the corresponding base layer is in a range between 5 degrees and 10 degrees.

The exemplary device illustrated in FIG. 1 is a III-nitride power semiconductor device, specifically a GaN HEMT (high electron mobility transistor). The presence of polarization charges and strain effects in a III-nitride heterostructure body due to spontaneous and piezoelectric polarization yield a two-dimensional charge carrier gas in a heterostructure body 100 of the device which is characterized by very high carrier density and carrier mobility. This two-dimensional charge carrier gas, such as a 2DEG (two-dimensional electron gas) or 2DHG (two-dimensional hole gas), forms the conductive channel of the device. The channel electrically connects source 102 and drain 104, and is controlled by a gate 106. A source-connected field plate 108 can be provided to redistribute the electric field within the device. In a broad sense, the semiconductor devices described herein can be formed from any unary, binary, ternary or quaternary semiconductor material system.

Regardless of the semiconductor technology used to fabricate the device, the device includes a plurality of dielectric layers 110 with openings formed therein. Electrically conductive material 112 such as metals disposed in the openings form contacts to the source, drain and gate regions 102, 104, 106 of the device, and form the field plate structures 108. At least some of the openings in the dielectric layers 110 of the device have sidewalls sloped at an angle between 5 and 50 degrees with respect to the main surface of the underlying base layer. The underlying base layer can be a semiconductor material such as Si, SiC, GaAs, a III-nitride material such as AlGaN, GaN, p-doped GaN, n-doped GaN, AlN, InN, InAlN, etc. The underlying base layer instead can be an oxide such as $SiO_2$, TaO, HfO, etc., a nitride such as SiN, SiON, etc. or any other suitable base material used in power semiconductor devices and to which or through which electrically conductive contacts are formed such as source, gate and/or drain contacts, field plate structures, etc.

Figure 2:
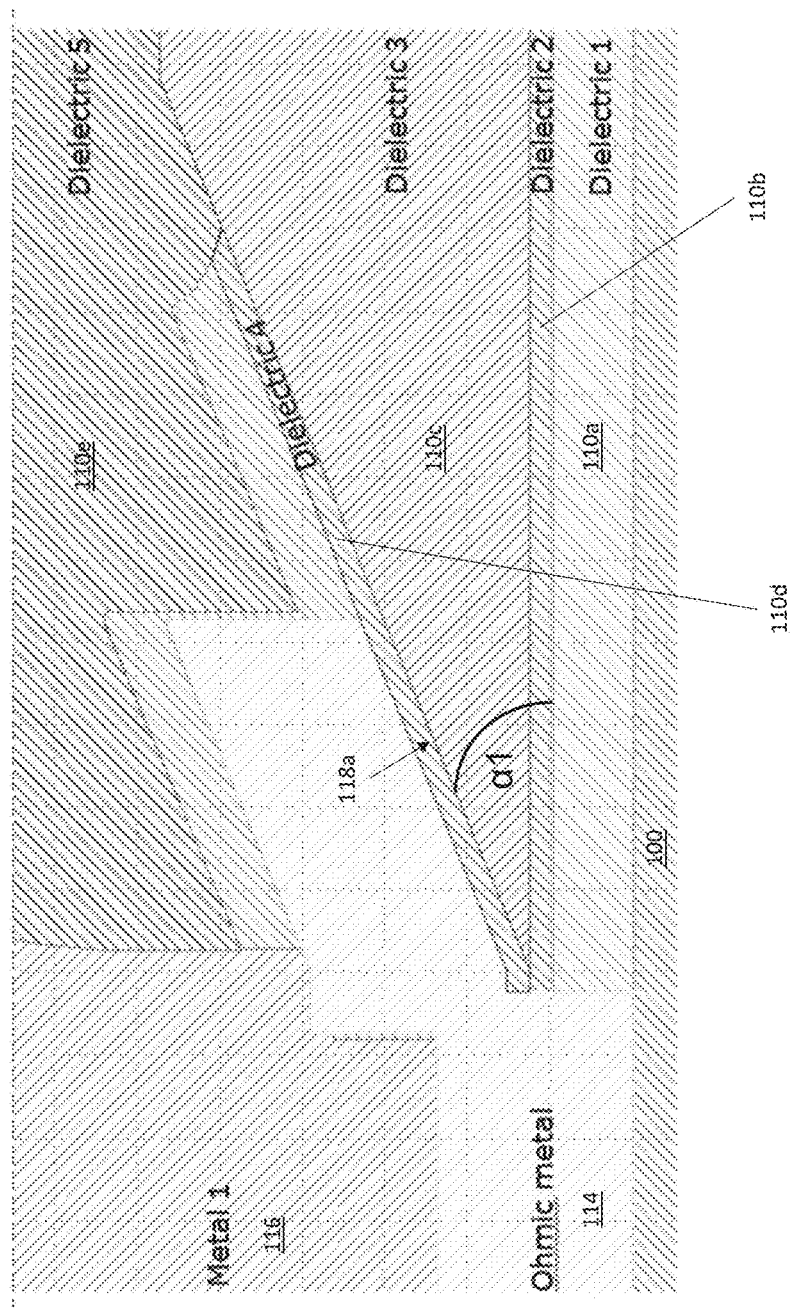
FIG. 2 illustrates an enlarged view of an ohmic contact structure included in the semiconductor device of FIG. 1.
Figure 3:
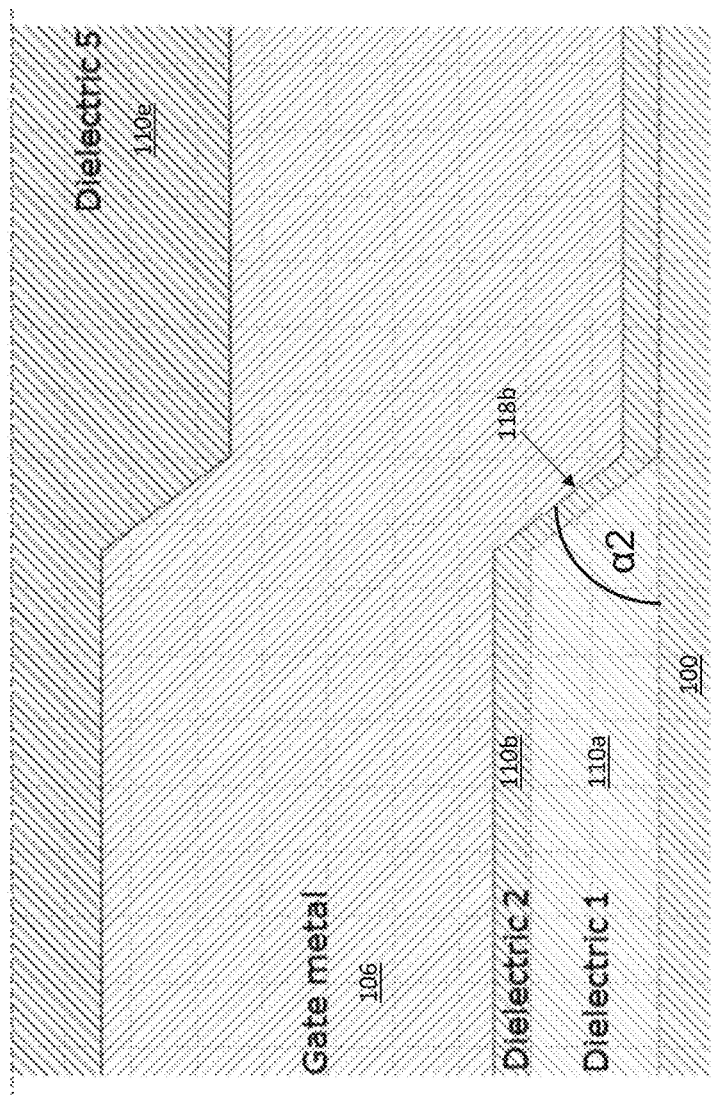
FIG. 3 illustrates an enlarged view of a gate contact structure included in the semiconductor device of FIG. 1.
Figure 4:
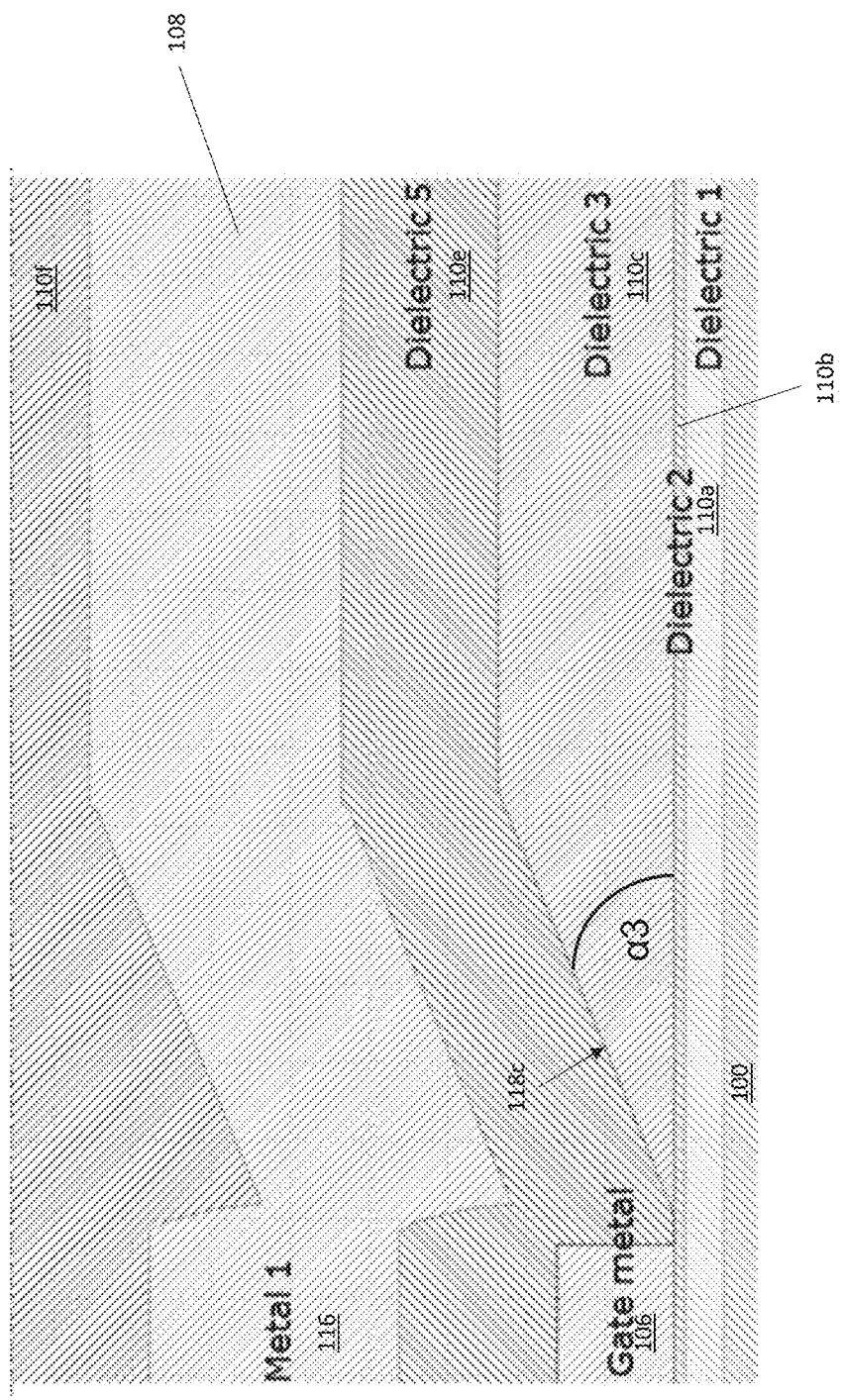
FIG. 4 illustrates an enlarged view of a field plate structure included in the semiconductor device of FIG. 1.

The exemplary power semiconductor device shown in FIG. 1 has sloped (slanted) ohmic contacts such as source and/or drain contacts, sloped (slanted) gate contacts and/or sloped (slanted) field plate structures, FIG. 2 is an expanded view of a sloped ohmic drain contact structure labelled 'A' in FIG. 1, FIG. 3 is an expanded view of a sloped gate contact structure labelled 'B' in FIG. 1, and FIG. 4 is an expanded view of a sloped field plate structure labelled 'C' in FIG. 1. The semiconductor device has a plurality of dielectric layers 110, and the openings formed in some of the dielectric layers have sidewalls sloped at an angle between 5 and 50 degrees with respect to the main surface of the corresponding base layer.

In FIG. 2, the ohmic drain contact includes an ohmic metal 114 which contacts the heterostructure body 100 of the device. A region 116 of an overlying first metal layer contacts the ohmic metal 114. The ohmic metal 114 contacts the heterostructure body 100 through an opening in four different dielectric layers 110a, 110b, 110c and 110d. The sidewall 118a of the opening along the third dielectric layer 110c in the ohmic contact area was formed by a damage implantation as will be described in more detail later herein. The sidewall 118a of the contact opening is sloped at an angle α1 between 5 and 50 degrees along the third dielectric layer 110c with respect to the main surface of the underlying base layer, which can be one of the underlying dielectric layers 110a, 110b or the underlying heterostructure body 100.

In FIG. 3, the slanted gate contact opening was formed by a sacrificial dielectric layer (not present) which had a higher etch rate than the first dielectric layer 110a as will be described in more detail later herein. The sidewall 118b of the gate contact opening is sloped at an angle α2 between 5 and 50 degrees with respect to the main surface of the underlying base layer, which is the heterostructure body 100 in this case. The gate 106 is separated from the heterostructure body 100 by the second dielectric 110b which functions as a gate dielectric in this region of the device.

In FIG. 4, the sloped sidewall 118c of the opening in the third dielectric layer 110c is formed by damage implantation as will be described in more detail later herein. An additional dielectric layer 110e deposited on the third dielectric layer 110c has the same angled sidewalls as the third dielectric layer 110c. The field plate 108 is formed in the overlying metal layer 116 deposited over part of the additional dielectric layer 110e, including on the sloped sidewall 118c of the additional dielectric layer 110e. The field plate 108 provides homogeneous or nearly homogenous electric field distribution in this region of the device due to the low angle of the sloped sidewall 118c. The sidewall 118c is sloped at an angle between 5 and 50 degrees with respect to the main surface of the underlying base layer, which can be one of the underlying dielectric layers 110a, 110b or the underlying heterostructure body 100.

Described next are various embodiments for manufacturing a semiconductor device having contact openings with sidewalls sloped (slanted) at an angle in a range between 5 degrees and 50 degrees with respect to an underlying base layer. According to each method embodiment, a dielectric layer is deposited over a base layer, an opening is etched through the dielectric layer to a main surface of the base layer, the opening having a sloped sidewall, wherein an angle between the sloped sidewall and the main surface of the base layer is in a range between 5 degrees and 50 degrees, and an electrically conductive material is deposited over the sloped sidewall.

Figure 5A:
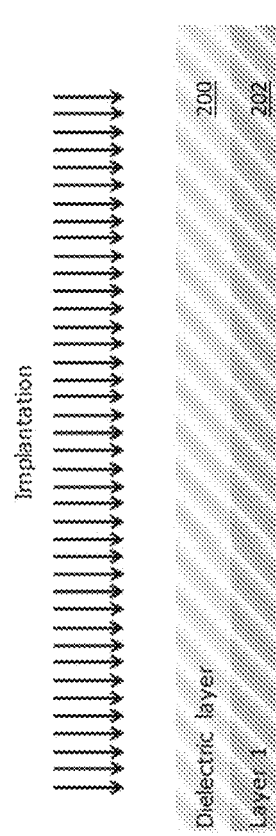
FIGS. 5A through 5E illustrate a method of manufacturing a semiconductor device having field plate and contact structures with sloped sidewalls, according to a first embodiment.
Figure 5B:
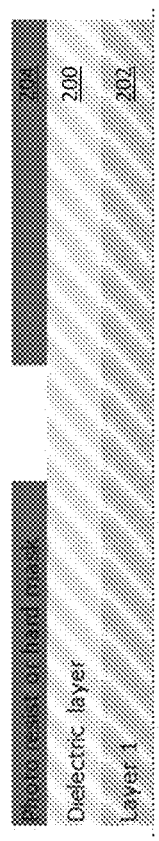
Figure 5C:
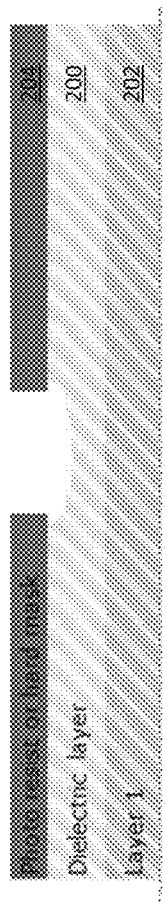
Figure 5D:
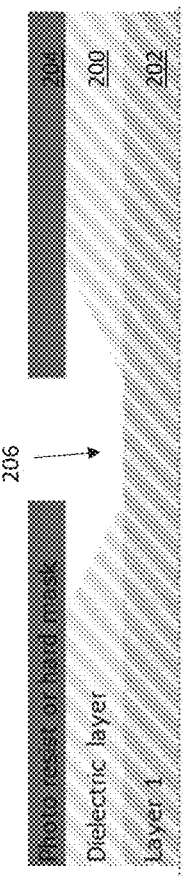
Figure 5E:
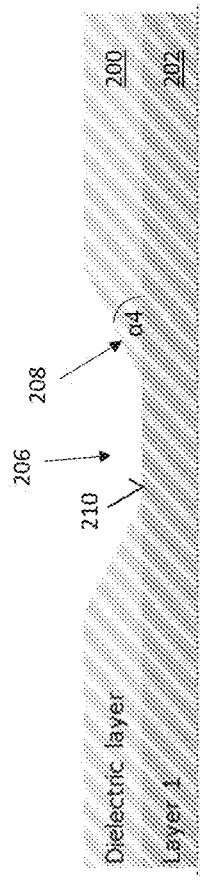

FIGS. 5A through 5E illustrate an embodiment of manufacturing a semiconductor device with contact openings having sidewalls sloped between 5 degrees and 50 degrees, by damage implantation. In FIG. 5A, a dielectric layer 200 is deposited over a base layer 202. Any standard dielectric layer and underlying base layer in power semiconductor devices can be used. For example, the base layer 202 can be formed by LPCVD (low-pressure chemical vapor deposition) of SiN. The dielectric layer 200 can be formed by PECVD (plasma-enhanced chemical vapor deposition) of TEOS (tetraethoxysilane) on the LPCVD SiN 200. A species such as Argon (Ar) is then implanted into the dielectric layer 200. In FIG. 5B, a photo resist or hard mask 204 is structured on the dielectric layer 200. In FIG. 5O, wet etching of the PECVD TEOS layer 200 with BHF commences to form an opening 206 in the dielectric layer 200. FIG. 5D shows the structure after completion of the wet etching, and FIG. 5E shows the structure after removal of the etch mask 204. A structured metal layer (not shown) can be deposited over the sloped sidewall 208 of the opening 206 formed in the TEOS layer 200 e.g. to form a gate contact or field plate, or an opening can be etched in the underlying SiN layer 202 to expose an underlying source or drain region of the transistor which can be contacted by an electrically conductive material deposited in the opening 206 and on the sloped sidewall 208 of the TEOS layer 200. FIGS. 2 through 4 illustrate exemplary structured metal layers.

The implantation shown in FIG. 5A creates damage in the upper part of the TEOS layer 200. The physical bombardment of the implantation species causes chemical bonding between molecules of the dielectric 200 to partially break, so that the (upper) damaged part chemically or dry etches faster in the lateral direction than the (lower) undamaged part. The etchant to which the dielectric layer 200 is exposed etches the damaged upper part of the dielectric layer 200 at a higher lateral etch rate than the undamaged lower part, forming the opening 206 in the dielectric layer with the sloped sidewall 208. The angle α4 between the sloped sidewall 208 and the main surface 210 of the underlying base layer 202 is in a range between 5 degrees and 50 degrees e.g. between 5 and 10 degrees.

Instead of SiN, the underlying base layer 202 can be AlGaN, GaN, p-doped GaN, InAlN, AlN, $SiO_2$, etc. Instead of PECVD TEOS for the dielectric layer 200 with the sloped sidewall 208, another dielectric can be used such as: LPCVD, PECVD, or spin-on SiN; LPCVD, PECVD or spin-on $SiO_2$; SiON; oxides like TaO and HfO; etc. The thickness of the dielectric layer 200 with the sloped sidewall 208 can vary between 5 nm and 5 μm, e.g. The implanted species used to damage the upper part of the dielectric layer 200 can be Ar, N, B, $BF_3$, As, $PH_3$ or Kr with different ionization states. The implantation energy can be in the range between 1 keV and 1 MeV. A hard mask comprising one or more metals or dielectrics can be used instead of a photo resist mask for etching the opening 206 in the dielectric layer 200. Depending on the type of deposited dielectric layer 200, a wet etchant such as HF, TMAH, $H_2O_2$, $H_3PO_4$, aqua regia, etc. can be used to form the opening 206 with the slanted sidewall 208. A dry etch process with $SF_6$, $CF_4$/$CH_3F$, $Cl_2$, $Cl_2$/$BCl_3$ can be used instead of a wet etch process to form the opening 206 in the dielectric layer 200. The structured metal layer (not shown) subsequently formed over the sloped sidewall 208 of the dielectric opening 206 can be floating, connected to a gate or drain contact, or connected to an external terminal.

Figure 6A:
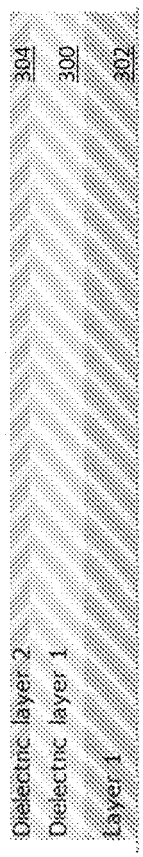
FIGS. 6A through 6E illustrate a method of manufacturing a semiconductor device having field plate and contact structures with sloped sidewalls, according to a second embodiment.

FIGS. 6A through 6E illustrate an embodiment of manufacturing a semiconductor device with contact openings having sidewalls sloped between 5 degrees and 50 degrees, by deposition of an additional dielectric layer. In FIG. 6A, a first dielectric layer 300 having a first lateral etch rate is deposited on a base layer 302 and a second dielectric layer 304 having a second lateral etch rate higher than the first lateral etch rate is deposited on the first dielectric layer 302. For example, SiN can be deposited on AlGaN by LPCVD followed by PECVD of SiN on the LPCVD SiN layer. LPCVD produces a more stoichiometric dielectric (SiN, $SiO_2$, etc.) compared to PECVD. A less stoichiometric dielectric has a faster lateral etch rate than a more stoichiometric dielectric. Hence, the upper dielectric layer 304 deposited by PECVD has a faster lateral etch rate than the lower dielectric layer 300 deposited by LPCVD even though both layers comprise SiN.

Figure 6B:
Figure 6C:
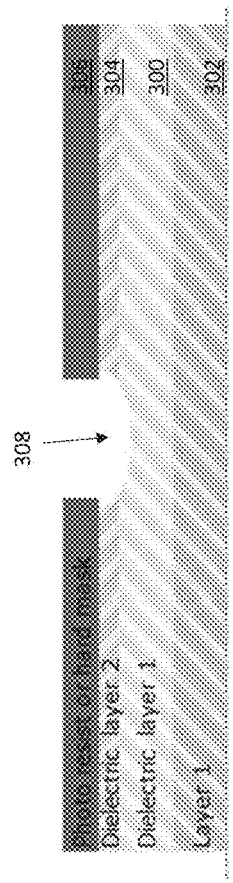
Figure 6D:
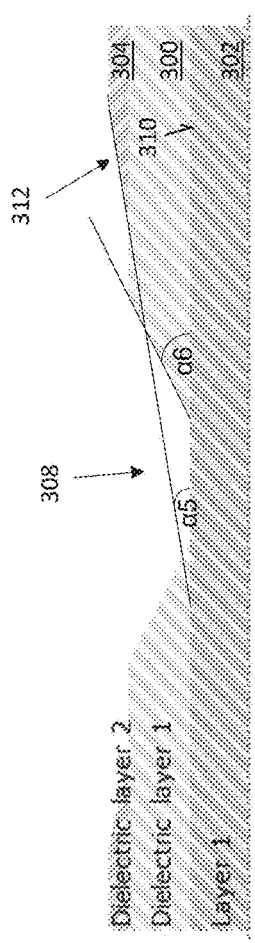
Figure 6E:
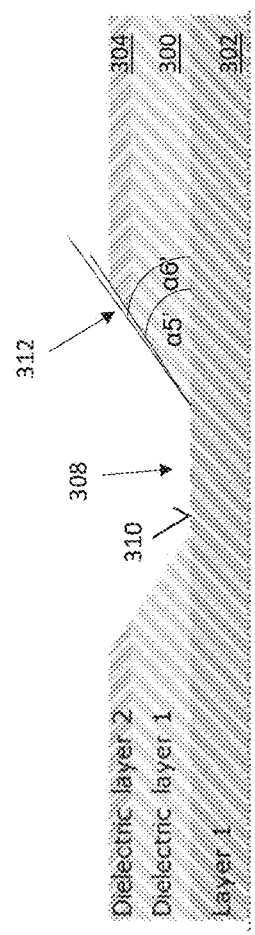

In FIG. 6B, a photo resist or hard mask 306 is formed on the upper dielectric layer 304. In FIG. 6C, etching of the dielectric layer stack with $CF_4$ commences. The upper PECVD dielectric layer 304 etches at a higher lateral etch rate than the lower LPCVD dielectric layer 300, to form an opening 308 through the dielectric layers 300, 304 to the main surface 310 of the base layer 302 and with a sloped sidewall 312. FIG. 6D shows the structure after completion of the etching and after removal of the etch mask 306. Due to the lateral etch rate difference between the upper and lower dielectric layers 304, 300, the sidewall 312 of the opening 308 along the upper dielectric layer 304 is sloped at an angle α5 with respect to the underlying base layer 302 that is less than the angle α6 of the sidewall 312 along the lower dielectric layer 300. Depending on the lateral etch rate difference, the degree of slope difference can be large as shown in FIG. 6D (e.g. tens of degrees difference: α6 minus α5) or less pronounced as shown in FIG. 6E (e.g. a few degrees difference: α6' minus α5'). In either case, the opening 308 in the upper dielectric layer 304 has a sidewall 312 sloped between 5 degrees and 50 degrees with respect to the underlying base layer 302. A structured metal layer (not shown) can be deposited over the sloped sidewall 312 of the opening 308 formed in the dielectric layer stack to form a gate contact or field plate in the case of a dielectric base layer, or the structured metal layer can contact a region of the device such as the source or drain in the case of a semiconductor base layer. FIGS. 2 through 4 illustrate exemplary structured metal layers.

Instead of AlGaN, the underlying base layer 302 can be GaN, p-doped GaN, n-doped GaN, AlN, $SiO_2$, SiN, SiON, TaO, HfO, InAlN, etc. Any combination of SiN (LPCVD, PECVD or spin-on), $SiO_2$ (LPCVD, PECVD or spin-on), SiON, and oxides such as TaO and HfO can replace the lower LPCVD SiN layer 300 and the upper PECVD SiN layer 304. For example, oxides have a higher lateral etch rate than nitrides. In this case, the lower dielectric layer 300 can be a nitride layer and the upper dielectric layer 304 can be an oxide layer. In another embodiment, the lower and upper dielectric layers 300, 304 comprise the same dielectric material such as $SiO_2$ or SiN, but the deposition parameters are controlled so that the lateral etch rate of the dielectric layers 300, 304 is different. For example, the lower dielectric layer 300 can be deposited by LPCVD and the upper dielectric layer 304 can be deposited by PECVD so that the lower dielectric layer 300 is more stoichiometric than the upper dielectric layer 304. In this case, the upper (less stoichiometric) dielectric layer 304 etches laterally faster than the lower (more stoichiometric) dielectric layer 300 even though the dielectric layers 300, 304 comprise the same material (e.g. SiN, $SiO_2$, etc.)

The thicknesses of the deposited dielectric layers 300, 304 can vary between 5 nm and 5 μm. A hard mask comprising one or more metals or dielectrics can be used instead of a photo resist mask. $SF_6$, $CF_4$/$CH_3F$, $Cl_2$, $Cl_2$/$BCl_3$ can be used as the etchant in a dry etch step. Dry etching can be replaced by wet etching with HF, TMAH, $H_2O_2$, $H_3PO_4$, aqua regia, etc. as the etchant depending on the type of deposited dielectric layers. In each case, the upper dielectric layer 304 is etched laterally at a faster rate than the lower dielectric layer 304 and therefore has a less steeply sloped sidewall angle compared to that of the lower dielectric layer 300.

Depending on the type of dielectric layers used, the lateral etch rates may be similar or even identical. As such, the degree of sidewall slope difference between the dielectric layers may be subtle as shown in FIG. 6E (e.g. a few degrees difference) or even nonexistent. For example, if the dielectric layers are important for electrical performance and therefore the material systems are restricted, the lateral etch rates may not be sufficiently different to yield a meaningful sidewall slope difference. In these cases, the upper dielectric layer 304 can be further processed prior to etching to alter the lateral etch rate of the upper dielectric layer 304.

Figure 7A:
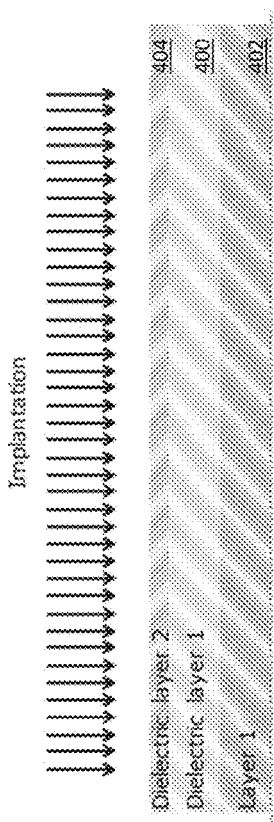
FIGS. 7A through 7E illustrate a method of manufacturing a semiconductor device having field plate and contact structures with sloped sidewalls, according to a third embodiment.

FIGS. 7A through 7E illustrate an embodiment of manufacturing a semiconductor device with contact openings having sidewalls sloped between 5 degrees and 50 degrees, by deposition of an additional dielectric layer and by damage implantation. In FIG. 7A, a first dielectric layer 400 is deposited on a base layer 402 and a second dielectric layer 404 is deposited on the first dielectric layer 400 which is then followed by an implantation step. The implanted species damages at least the top part of the upper dielectric layer 404. The species can be implanted at a sufficiently high energy so that the upper dielectric layer 404 is damaged over the entire thickness of the layer 404. The implantation species and energy can be selected so that the species penetrates the lower dielectric layer 400 as well. However, at least part of the lower dielectric layer 400 remains undamaged by the implanted species so that the damaged part of the dielectric layer(s) has a faster lateral etch rate than the undamaged part.

Figure 7B:
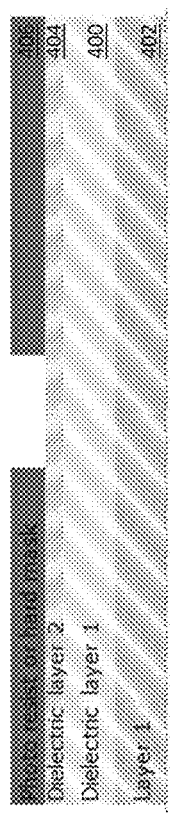
Figure 7C:
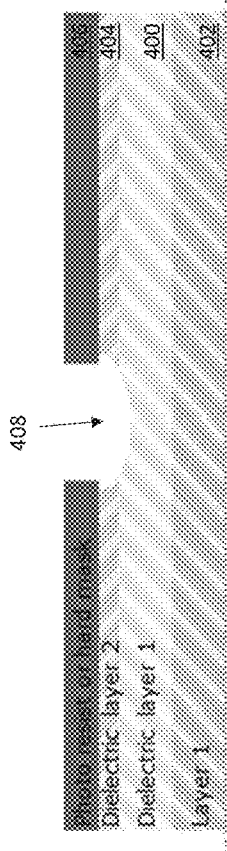
Figure 7D:
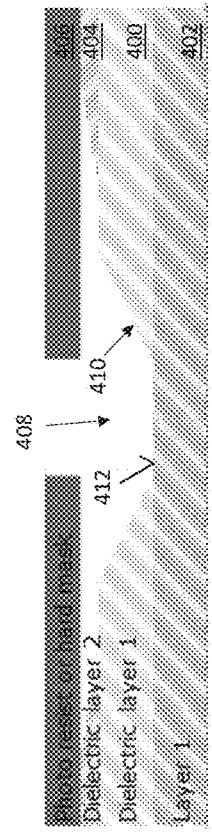
Figure 7E:
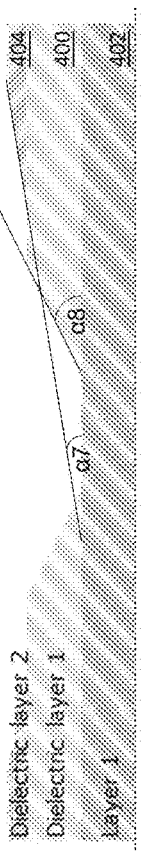

In FIG. 7B, a photo resist or hard mask 406 is formed on the upper dielectric layer 404. Wet or dry etching of the dielectric layer stack commences in FIG. 7C to form an opening 408 in the dielectric layers 400, 404. FIG. 7D shows the structure after completion of the etching, and FIG. 7E shows the structure after removal of the etch mask 406. A structured metal layer (not shown) can be deposited over the sloped sidewall 410 of the opening 408 formed in the dielectric layers 400, 404 to form a gate, source or drain contact, or a field plate structure. FIGS. 2 through 4 illustrate exemplary structured metal layers.

The implantation step shown in FIG. 7A creates damage at least in the top part of the upper dielectric layer 404. The physical bombardment of the implantation species causes chemical bonding between molecules of the dielectric to partially break, so that the damaged part chemically or dry etches faster in the lateral direction than the undamaged part. The etchant to which the dielectric layers 400, 404 are exposed etches the upper (damaged) dielectric layer 404 at a higher lateral etch rate than the lower (undamaged) dielectric layer 400, to form an opening 408 through the upper and lower dielectric layers 404, 400 to the main surface 412 of the base layer 402. The angle α7 between the sloped sidewall 410 and the main surface 412 of the base layer 402 is smaller along the upper (damaged) dielectric layer 404 than the angle α8 of the sloped sidewall 410 along the lower (undamaged) dielectric layer 400 as shown in FIG. 7E. This way, a structured metal layer subsequently formed on the sloped sidewall 410 along the lower (undamaged) dielectric layer 400 and along the upper (damaged) dielectric layer 404 slopes at a greater angle with respect to the main surface 412 of the base layer 402 along the lower (undamaged) dielectric layer 400 than along the upper (damaged) dielectric layer 404.

The base layer 402 can be AlGaN, GaN, p-doped GaN, n-doped GaN, AlN, $SiO_2$, SiN, SiON, TaO, HfO, InAlN, etc. Any combination of SiN (LPCVD, PECVD or spin-on), $SiO_2$ (LPCVD, PECVD or spin-on), SiON, oxides such as TaO and HfO, etc, can be used for the dielectric layers 400, 404. The thicknesses of the dielectric layers 400, 404 can vary between 5 nm and 5 μm. The implanted species can be Ar, N, B, BF, As, Ph, Kr, etc. with different ionization states. The implantation energy can be in the range of 1 keV to 1 MeV. A photo resist mask or a hard mask comprising one or more metals or dielectrics can be used as the etch mask 406. $CF_4$, $CF_4/CH_3F$, $Cl_2$, $Cl_2/BCl_3$, etc. can be used as the etchant in a dry etch step. HF, TMAH, $H_2O_2$, $H_3PO_4$, aqua regia, etc. can be used in a wet etch step. Dry etching can be replaced by wet etching with HF, TMAH, $H_2O_2$, $H_3PO_4$, aqua regia, etc. depending on the type of dielectric layers 400, 404. A mask (not shown) can be formed on the upper dielectric layer 404 prior to implanting the species into the upper dielectric layer 404. The mask is selected so that the species are implanted into a targeted region of the upper dielectric layer 404 corresponding to the desired opening 408 and blocked elsewhere. Any suitable hard mask such as a metal or thick dielectric can be used to block the implanted species except in the desired implant region.

The dielectric layer through which an opening is to be formed may be too thin for implantation without risking damage to the underlying base layer. In this case, a sacrificial layer can be used to slow down the implanted species and prevent the implanted species from entering the underlying base layer.

FIGS. 8A through 8E illustrate an embodiment of manufacturing a semiconductor device with contact openings having sidewalls sloped between 5 degrees and 50 degrees, by implantation through a sacrificial layer. In FIG. 7A, a permanent dielectric layer 500 is deposited on a base layer 502 and a sacrificial dielectric layer 504 is deposited on the permanent dielectric layer 500 which is then followed by an implantation step. The species is implanted through the sacrificial dielectric layer 504 and into the permanent dielectric layer 500 to form a damaged upper part above an undamaged lower part of the permanent dielectric layer 500. The sacrificial layer 504 slows down the implanted species so that the species penetrates the permanent dielectric layer 500, but without entering the underlying base layer 502. The damaged (upper) part of the permanent dielectric layer 500 has a faster lateral etch rate than the undamaged (lower) part.

Figure 8A:
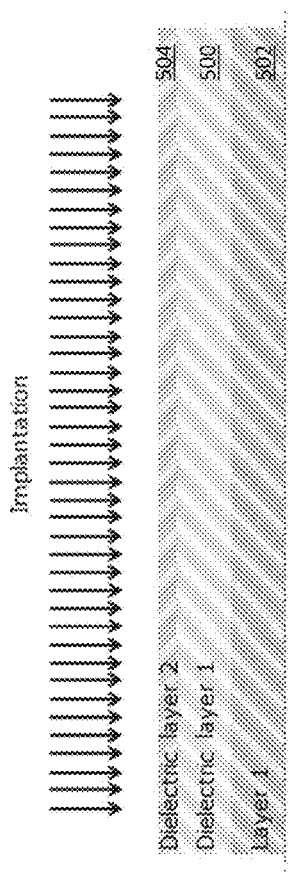
FIGS. 8A through 8E illustrate a method of manufacturing a semiconductor device having field plate and contact structures with sloped sidewalls, according to a fourth embodiment.
Figure 8B:
Figure 8C:
Figure 8D:
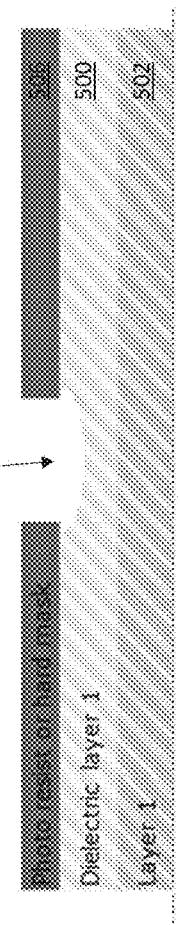
Figure 8E:
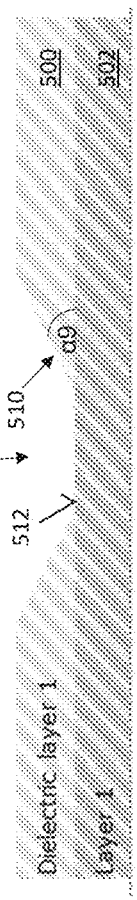

In FIG. 8B, the sacrificial dielectric layer 504 is removed after implanting the species. In FIG. 8C, a photo resist or hard mask 506 is formed on the permanent (implanted) dielectric layer 500 after removing the sacrificial dielectric layer 504. Etching of the permanent (implanted) dielectric layer 500 commences in FIG. 8D to form an opening 508 in the permanent dielectric layer 500. FIG. 8E shows the structure after completion of the etching, and after removal of the etch mask 506. A structured metal layer (not shown) can be deposited over the sloped sidewall 510 of the opening 508 formed in the permanent dielectric layer 500 to form a gate, source or drain contact, or a field plate structure, depending on the composition of the underlying base layer 502. FIGS. 2 through 4 illustrate exemplary structured metal layers.

The implantation shown in FIG. 8A creates damage in the permanent dielectric layer 500. The physical bombardment of the implantation species causes chemical bonding between molecules of the dielectric to partially break, so that the (upper) damaged part chemically or dry etches faster in the lateral direction than the (lower) undamaged part. The etchant to which the permanent dielectric layer 500 is exposed etches the damaged upper part of the dielectric layer 500 at a higher lateral etch rate than the undamaged lower part, forming an opening 508 in the dielectric layer 500 with a sloped sidewall 510. The angle α9 between the sloped sidewall 510 and the main surface 512 of the underlying base layer 502 is in a range between 5 degrees and 50 degrees e.g. between 5 and 10 degrees, as shown in FIG. 8E.

The base layer 502 can comprise AlGaN, GaN, p-doped GaN, n-doped GaN, AlN, $SiO_2$, SiN, SiON, TaO, HfO, InAlN, etc. Any combination of SiN (LPCVD, PECVD or spin-on), $SiO_2$ (LPCVD, PECVD or spin-on), SiON, oxides such as TaO and HfO, etc. can be used for the dielectric layers 500, 504. The thicknesses of the permanent dielectric layer 500 can vary between 5 nm and 5 μm. The implanted species can be Ar, N, B, BF, As, Ph, Kr, etc. with different ionization states. The implantation energy can be in the range of 1 keV to 1 MeV. Removal of the sacrificial dielectric layer 504 after the damage implantation can be done by wet or dry etching. A photo resist mask or a hard mask comprising one or more metals or dielectrics can be used as the etch mask 506. $CF_4$, $CF_4/CH_3F$, $Cl_2$, $Cl_2/BCl_3$, etc. can be used as the etchant in a dry etch step. HF, TMAH, $H_2O_2$, $H_3PO_4$, aqua regia, etc, can be used as the etchant in a wet etch step. Dry etching can be replaced by wet etching with HF, TMAH, $H_2O_2$, $H_3PO_4$, aqua regia, etc., depending on the type of permanent dielectric layer 500 used.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming an opening in a dielectric layer, the method comprising:
    depositing a dielectric layer stack comprising a plurality of dielectric layers and in contact with a main surface of a heterostructure body;
    etching an opening at least partly through the dielectric layer stack in a direction of the main surface of the heterostructure body, the opening having a sloped sidewall, wherein an angle between the sloped sidewall and the main surface of the heterostructure body is in a range between 5 degrees and 50 degrees; and
    depositing an electrically conductive material over the sloped sidewall,
    wherein the electrically conductive material is an ohmic metal which contacts the heterostructure body, a gate contact which contacts a gate of a semiconductor device, or a field plate which extends in a direction from the gate towards a drain of a semiconductor device.

2. The method of claim 1, wherein etching the opening comprises:
    implanting a species into the dielectric layer so as to form a damaged upper part above an undamaged lower part of the dielectric layer stack;
    depositing a mask on the damaged upper part of the dielectric layer stack; and
    etching the dielectric layer stack with an etchant that etches the damaged upper part at a higher lateral etch rate than the undamaged lower part, to form the opening with the sloped sidewall.

3. The method of claim 2, wherein the species implanted into the dielectric layer stack are selected from the group consisting of: Ar; N; B; BF3; As; PH3; and Kr with different ionization states.

4. The method of claim 1, wherein depositing the dielectric layer stack in contact with the main surface of the heterostructure body comprises:
    depositing a first dielectric layer having a first lateral etch rate on the heterostructure body; and
    depositing a second dielectric layer having a second lateral etch rate higher than the first lateral etch rate on the first dielectric layer.

5. The method of claim 4, wherein etching the opening comprises:
    depositing a mask on the second dielectric layer; and
    etching the second dielectric layer and the first dielectric layer with an etchant that etches the second dielectric layer at a higher lateral etch rate than the first dielectric layer, to form the opening through the first and second dielectric layers to the main surface of the heterostructure body and with the sloped sidewall.

6. The method of claim 4, wherein the first dielectric layer is a nitride and the second dielectric layer is an oxide.

7. The method of claim 4, wherein the first and second dielectric layers comprise the same dielectric material, and wherein the first dielectric layer is deposited by low-pressure chemical vapor deposition and the second dielectric layer is deposited by plasma-enhanced chemical vapor deposition so that the first dielectric layer is more stoichiometric than the second dielectric layer.

8. The method of claim 1, wherein depositing the dielectric layer stack in contact with the main surface of the heterostructure body comprises:
    depositing a first dielectric layer on the heterostructure body; and
    depositing a second dielectric layer on the first dielectric layer.

9. The method of claim 8, wherein etching the opening comprises:
    implanting a species into the second dielectric layer so as to damage the second dielectric layer;
    depositing a mask on the second dielectric layer after implanting the species; and
    etching the second dielectric layer and the first dielectric layer with an etchant after depositing the mask, the etchant etching the damaged second dielectric layer at a higher lateral etch rate than the first dielectric layer, to form the opening through the damaged second dielectric layer and the first dielectric layer to the main surface of the heterostructure body, wherein the angle between the sloped sidewall and the main surface of the heterostructure body is greater along the first dielectric layer than along the damaged second dielectric layer.

10. The method of claim 9, wherein the electrically conductive material is deposited on the sloped sidewall of the opening along the first dielectric layer and along the damaged second dielectric layer so that an angle between the electrically conductive material and the main surface of the heterostructure body is greater along the first dielectric layer than along the damaged second dielectric layer.

11. The method of claim 9, wherein the species is implanted into an upper part of the first dielectric layer so that the upper part of the first dielectric layer is damaged by the implanted species and has a higher lateral etch rate than a lower part of the first dielectric layer that is undamaged by the implanted species.

12. The method of claim 9, further comprising:
    forming a mask on the second dielectric layer prior to implanting the species into the second dielectric layer, so that the species are implanted into a targeted region of the second dielectric layer corresponding to the opening and blocked elsewhere.

13. The method of claim 9, wherein the species implanted into the second dielectric layer are selected from the group consisting of: Ar; N; B; BF3; As; PH3; and Kr with different ionization states.

14. The method of claim 8, wherein etching the opening comprises:
implanting a species through the second dielectric layer and into the first dielectric layer so as to form a damaged upper part above an undamaged lower part of the first dielectric layer;
removing the second dielectric layer after implanting the species;
depositing a mask on the first dielectric layer after removing the second dielectric layer; and
etching the first dielectric layer with an etchant that etches the damaged upper part at a higher lateral etch rate than the undamaged lower part, to form the opening with the sloped sidewall.

15. The method of claim 1, wherein the heterostructure body is selected from the group consisting of: AlGaN; GaN; p-doped GaN; n-doped GaN; AlN; and InAlN.

16. A semiconductor device, comprising:
a heterostructure body;
a dielectric layer stack comprising a plurality of dielectric layers and in contact with a main surface of the heterostructure body;
an opening extending at least partly through the dielectric layer stack in a direction of the main surface of the heterostructure body, the opening having a sloped sidewall; and
an electrically conductive material over the sloped sidewall,
wherein an angle between the sloped sidewall and the main surface of the heterostructure body is in a range between 5 degrees and 50 degrees,
wherein the electrically conductive material is an ohmic metal which contacts the heterostructure body, a gate contact which contacts a gate of the semiconductor device, or a field plate which extends in a direction from the gate towards a drain of the semiconductor device.

17. The semiconductor device of claim 16, wherein a damaged upper part of the dielectric layer stack has a higher lateral etch rate than a lower undamaged part of the dielectric layer.

18. The semiconductor device of claim 16, wherein a lower part of the dielectric layer stack has a lower lateral etch rate than an upper part of the dielectric layer stack.

19. The semiconductor device of claim 18, wherein the lower part of the dielectric layer stack comprises an oxide and the upper part of the dielectric layer stack comprises a nitride.

20. The semiconductor device of claim 18, wherein the lower part of the dielectric layer stack and the upper part of the dielectric layer stack comprise the same dielectric material, and wherein the lower part of the dielectric layer stack is less stoichiometric than the upper part of the dielectric layer stack.

21. The semiconductor device of claim 18, wherein an angle between the electrically conductive material and the main surface of the heterostructure body is greater along a lower part of the dielectric layer stack than along an upper part of the dielectric layer stack.

22. The semiconductor device of claim 16, wherein the heterostructure body is selected from the group consisting of: AlGaN; GaN; p-doped GaN; n-doped GaN; AlN; and InAlN.

23. The semiconductor device of claim 16, wherein the angle between the sloped sidewall and the main surface of the heterostructure body is in a range between 5 degrees and 10 degrees.

* * * * *